United States Patent
Burkman et al.

(10) Patent No.: US 10,534,030 B2
(45) Date of Patent: Jan. 14, 2020

(54) VEHICLE HIGH VOLTAGE SHIELD BASED INTERLOCK

(71) Applicant: Ford Global Technologies, LLC, Dearborn, MI (US)

(72) Inventors: Wesley Edward Burkman, Dearborn, MI (US); Benjamin A. Tabatowski-Bush, South Lyon, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 201 days.

(21) Appl. No.: 15/618,805

(22) Filed: Jun. 9, 2017

(65) Prior Publication Data
US 2018/0356454 A1    Dec. 13, 2018

(51) Int. Cl.
| | |
|---|---|
| G01R 31/04 | (2006.01) |
| B60R 16/00 | (2006.01) |
| G01R 31/00 | (2006.01) |
| B60R 16/02 | (2006.01) |

(52) U.S. Cl.
CPC ............ G01R 31/04 (2013.01); B60R 16/005 (2013.01); G01R 31/006 (2013.01); B60R 16/0215 (2013.01)

(58) Field of Classification Search
CPC ... B60L 11/18; B60L 3/00; B60L 3/04; B60R 16/005; B60R 16/0215; B60R 16/00; B60R 16/02; B60R 16/03; G01R 31/006; G01R 31/04; G01R 31/00; G01R 31/02
See application file for complete search history.

(56) References Cited

U.S. PATENT DOCUMENTS

| | | | |
|---|---|---|---|
| 5,053,914 A * | 10/1991 | Wessel | B03C 3/68 361/235 |
| 5,336,934 A * | 8/1994 | Toepfer | H01R 11/287 307/10.1 |
| 5,341,265 A | 8/1994 | Westrom et al. | |
| 5,990,687 A | 11/1999 | Williams | |
| 6,603,290 B2 | 8/2003 | Hochgraf | |
| 7,641,499 B1 | 1/2010 | George et al. | |
| 7,977,814 B2 | 7/2011 | Lucas et al. | |
| 8,043,108 B2 | 10/2011 | Engbring et al. | |
| 8,597,043 B2 | 12/2013 | Zhao | |
| 2003/0218451 A1* | 11/2003 | Mori | H03F 1/486 323/282 |
| 2014/0291017 A1* | 10/2014 | Kuji | H01R 13/641 174/72 A |
| 2016/0290876 A1* | 10/2016 | Koeppendoerfer | G01K 7/343 |
| 2017/0010329 A1* | 1/2017 | Tang | H04Q 9/00 |
| 2018/0105125 A1* | 4/2018 | Gabriel | B60L 3/04 |

FOREIGN PATENT DOCUMENTS

| | | | | |
|---|---|---|---|---|
| CN | 103441381 B | 8/2015 | | |
| WO | WO-2015091552 A1 * | 6/2015 | ............. | G01K 7/343 |

* cited by examiner

*Primary Examiner* — Jared Fureman
*Assistant Examiner* — Emmanuel Dominique
(74) *Attorney, Agent, or Firm* — David B. Kelly; Brooks Kushman P.C.

(57) ABSTRACT

A power system for a vehicle includes a traction battery that provides power to drive the vehicle, a load, and a harness having wires electrically connecting the traction battery and load, and shielding covering the wires. The power system further includes one or more control blocks that drive a signal onto the shielding, and responsive to an absence of detecting feedback from the signal, issue an interlock integrity alert.

18 Claims, 3 Drawing Sheets

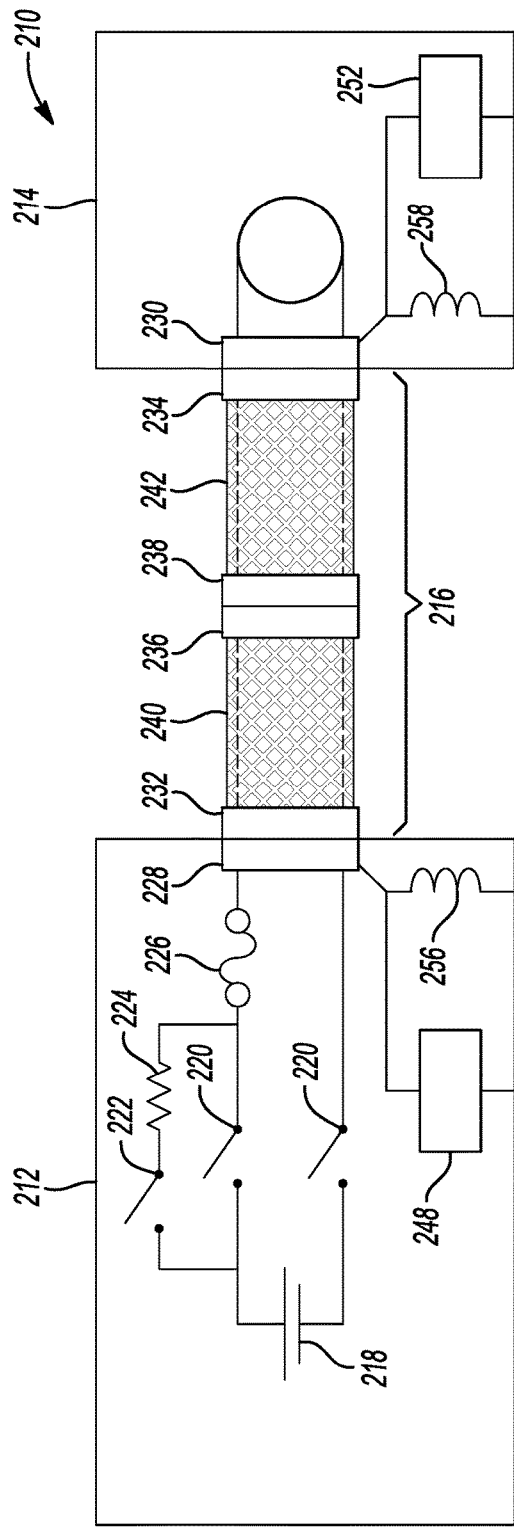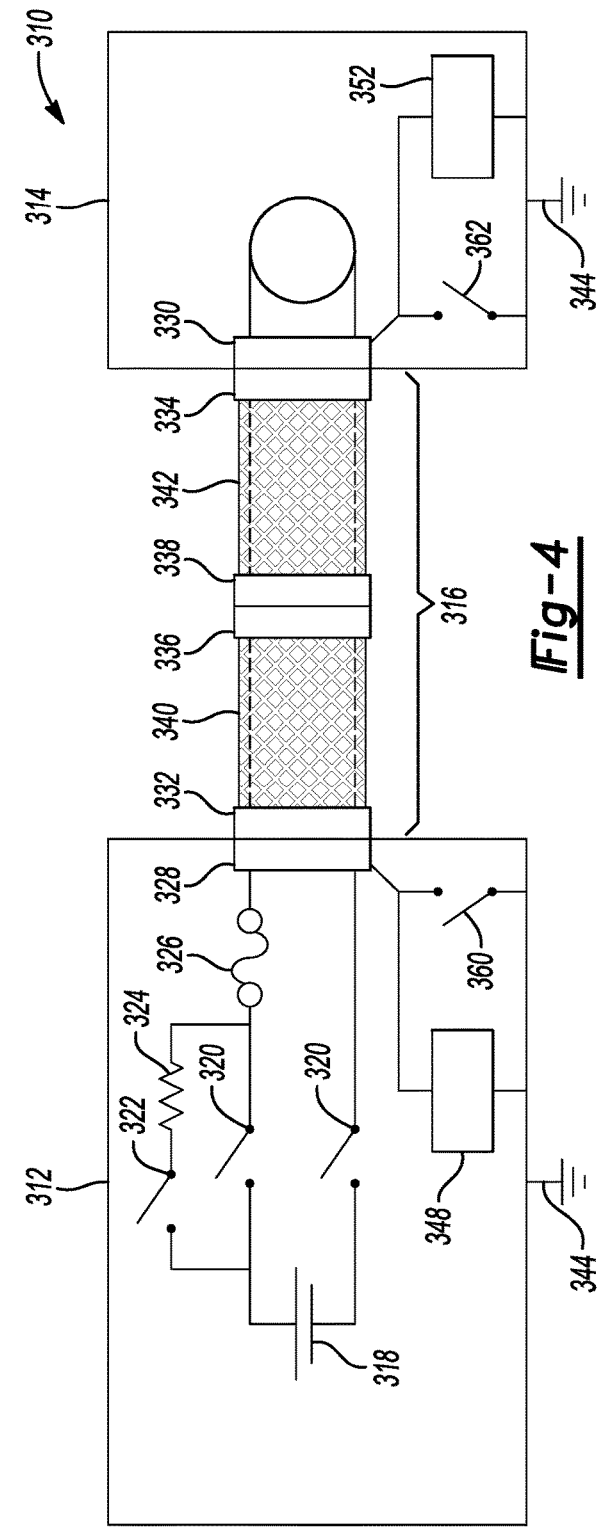

VEHICLE HIGH VOLTAGE SHIELD BASED INTERLOCK

TECHNICAL FIELD

This disclosure relates to mechanisms for detecting the integrity of connections in a vehicle high voltage power system.

BACKGROUND

Certain vehicles may be driven via an electric machine that is powered by a high voltage traction battery. This traction battery may also be used to power other loads requiring high voltage. Wiring harnesses are typically used to electrically connect the traction battery and these so-called high voltage loads.

SUMMARY

A power system for a vehicle includes a traction battery configured to provide power to drive the vehicle, a load, a harness including wires electrically connecting the traction battery and load, and shielding covering the wires, and one or more control blocks programmed to drive a signal onto the shielding, and responsive to an absence of detecting feedback from the signal, to issue an interlock integrity alert.

A vehicle power system includes a battery arrangement including cells and a first control block, a vehicle load system including a load and a second control block, and a harness including wires electrically connecting the cells and load, and shielding covering the wires. The first control block is programmed to drive a signal onto the shielding. The second control block is programmed to issue an interlock integrity alert responsive to an interrupt in detecting the signal.

A method for interlock detection comprising, by one or more control blocks, driving a signal onto shielding of a wiring harness that electrically connects a traction battery and a load configured to receive power from the traction battery, and responsive to an absence of detecting feedback from the signal, issuing an interlock integrity alert.

BRIEF DESCRIPTION OF THE DRAWINGS

FIGS. 2-5 are schematic diagrams of other vehicle high voltage power systems.

DETAILED DESCRIPTION

Various embodiments of the present disclosure are described herein. However, the disclosed embodiments are merely exemplary and other embodiments may take various and alternative forms that are not explicitly illustrated or described. The figures are not necessarily to scale; some features may be exaggerated or minimized to show details of particular components. Therefore, specific structural and functional details disclosed herein are not to be interpreted as limiting, but merely as a representative basis for teaching one of ordinary skill in the art to variously employ the present invention. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. However, various combinations and modifications of the features consistent with the teachings of this disclosure may be desired for particular applications or implementations.

The processes, methods, logic, or strategies disclosed may be deliverable to and/or implemented by a processing device, controller, or computer, which may include any existing programmable electronic control unit or dedicated electronic control unit. Similarly, the processes, methods, logic, or strategies may be stored as data and instructions executable by a controller or computer in many forms including, but not limited to, information permanently stored on various types of articles of manufacture that may include persistent non-writable storage media such as ROM devices, as well as information alterably stored on writeable storage media such as floppy disks, magnetic tapes, CDs, RAM devices, and other magnetic and optical media. The processes, methods, logic, or strategies may also be implemented in a software executable object. Alternatively, they may be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

Figure 1:
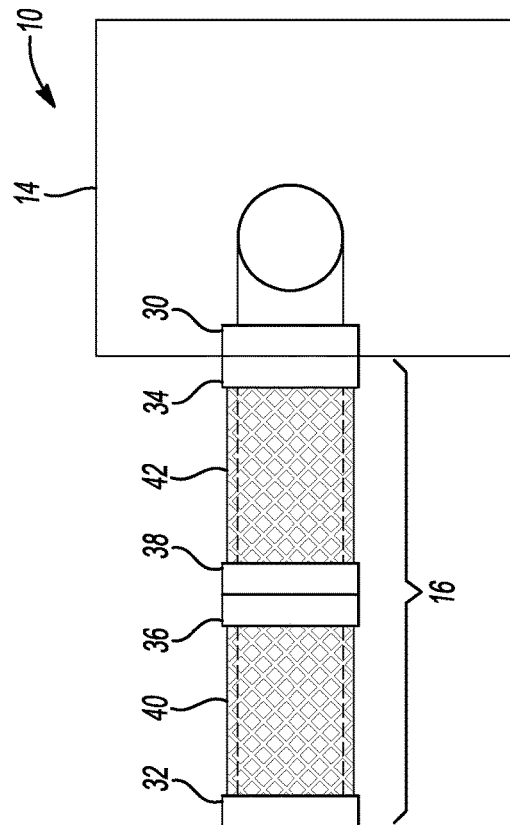
FIG. 1 is a schematic diagram of a conventional vehicle high voltage power system.

Referring to FIG. 1, a conventional vehicle high voltage power system 10 includes a high voltage battery system 12, a high voltage load 14, and an in-line high voltage connector arrangement 16 electrically connecting the high voltage battery system 12 and high voltage load 14. The high voltage battery system 12 includes battery cells 18, main contactors 20, a pre-charge contactor and pre-charge resistor 22, 24 respectively, a main fuse 26, and a connector mount 28. The high voltage load 14 (e.g., an inverter, a DC/DC converter, an electric A/C module, etc.) includes a connector mount 30. The in-line high voltage connector arrangement 16 includes end mounts 32, 34 that mate with connector mounts 28, 30 respectively, in-line mounts 36, 38 that mate with each other, and high voltage shielding 40, 42 (between the end mount 32 and in-line mount 36, and between the end mount 34 and in-line mount 38 respectively). Additionally, each of the high voltage battery system 12 and high voltage load 14 are grounded to chassis (not shown) at ground 44.

If an inline connector is used between a high voltage battery and load, it may include a mechanism to monitor that the connector is fully seated. Typically, high voltage interlock loops (HVILs) are used for this purpose. Certain inline connectors, however, require that low voltage HVIL wires be routed along with high voltage (HV) harness components. During such routing, the low voltage HVIL wires may get caught or abraded. Moreover, the low voltage HVIL wires do not carry current so they may be smaller and more fragile than the HV harness components.

The inventors have discovered that low voltage HVIL wires may not be necessary if instead a signal is transmitted over shielding associated with the HV harness components. As an example, a signal generator may drive a signal onto the shielding on one end of the connection, and a control block (e.g., a processor or state machine, front-end circuitry, etc. as known by those of ordinary skill) may detect the signal on the other end of the connection. A break in the connection would prevent the signal from travelling over the shielding. Thus, the control block may initiate protective measures responsive to a loss in signal detection: The control block may issue an alert that causes the high voltage battery to discontinue supplying power via the HV harness components, etc.

The signal generator may be associated with the high voltage battery, the load, or another system. Likewise, the control block may be associated with the load, the high voltage battery, or another system. Although each of the high voltage battery and load are typically grounded, such ground presents some impedance to radio frequency (RF) signals. Thus, the signal generator may be configured to drive an RF signal onto the shielding.

As another example, a control block, that includes a signal driver, may drive a signal onto the shielding on one end of the connection. And because the high voltage battery and load are both grounded to chassis, the signal may travel between the high voltage battery and load first over the shielding and then over the chassis to be detected by the control block (a circuit of sorts). A break in the connection would prevent the signal from travelling over the shielding. Other arrangements are also contemplated.

Figure 2:
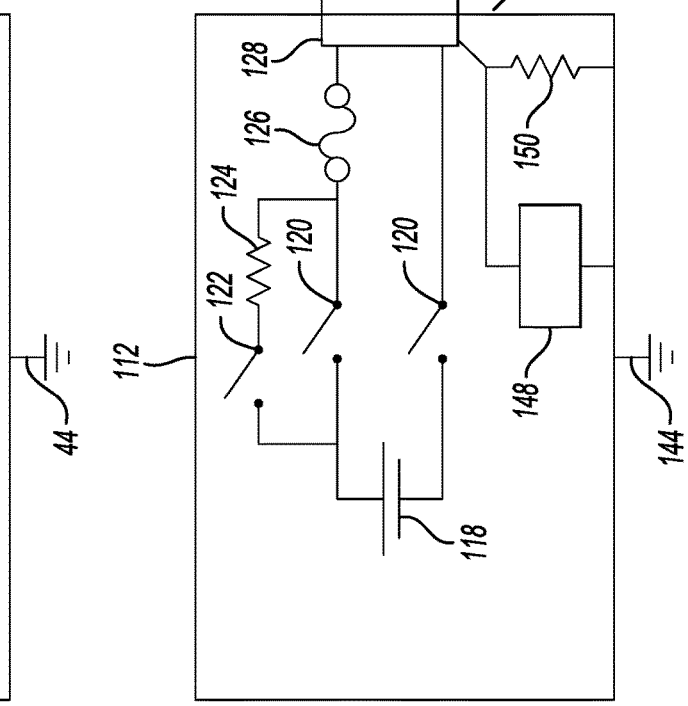

Referring to FIG. 2, a vehicle high voltage power system 110 includes a high voltage battery system 112, a high voltage load 114, and an in-line high voltage connector arrangement 116 electrically connecting the high voltage battery system 112 and high voltage load 114. The high voltage battery system 112 includes battery cells 118, main contactors 120, a pre-charge contactor and pre-charge resistor 122, 124 respectively, a main fuse 126, and a connector mount 128. The high voltage load 114 includes a connector mount 130. The in-line high voltage connector arrangement 116 includes end mounts 132, 134 that mate with connector mounts 128, 130 respectively, in-line mounts 136, 138 that mate with each other, and high voltage shielding 140, 142 (between the end mount 132 and in-line mount 136, and between the end mount 134 and in-line mount 138 respectively). Additionally, each of the high voltage battery system 112 and high voltage load 114 are grounded to chassis (not shown) at ground 144.

The high voltage battery system 112 also includes a control block 148 and a grounding resistor 150. And, the high voltage load 114 includes a control block 152 and a grounding resistor 154. The control block 148 is electrically connected to the in-line high voltage connector arrangement 116 and to the ground 144 through the grounding resistor 150. Similarly, the control block 152 is electrically connected to the in-line high voltage connector arrangement 116 and to the ground 144 through the grounding resistor 154. (In certain circumstances, transmitting the signal may be difficult because both sides of the connection are shorted to the ground 144. If the ground connection is made through a resistor however, a signal can be more easily sent over the high voltage shielding 140, 142.) Either of the control blocks 148, 152 (or another control block) may be configured to drive a signal onto the in-line high voltage connector arrangement 116. The other of the control blocks 148, 152 (or another control block) may then be configured to detect the signal for interlock integrity.

The efficiency of a shield ground decreases if the ground connection has a high resistance. Inductors can be used instead of resistors to allow low frequency noise to pass to ground, and high frequency signals to be filtered from ground. The inductance selected may define "low frequency" as any typical HV bus noise (e.g., 750 kHz and below), and "high frequency" as any typical HV signal (e.g., 10 Mhz and above).

The signal frequency may need to be tuned for each application so that a difference in connector state is detectable, and so that it is out of the typical frequencies seen from the shielded HV noise on the shielding line. In certain circumstances, the shield may need to be designed to be "last to make" and "first to break."

Referring to FIG. 3, a vehicle high voltage power system 210 includes a high voltage battery system 212, a high voltage load 214, and an in-line high voltage connector arrangement 216 electrically connecting the high voltage battery system 212 and high voltage load 214. The high voltage battery system 212 includes battery cells 218, main contactors 220, a pre-charge contactor and pre-charge resistor 222, 224 respectively, a main fuse 226, and a connector mount 228. The high voltage load 214 includes a connector mount 230. The in-line high voltage connector arrangement 216 includes end mounts 232, 234 that mate with connector mounts 228, 230 respectively, in-line mounts 236, 238 that mate with each other, and high voltage shielding 240, 242 (between the end mount 232 and in-line mount 236, and between the end mount 234 and in-line mount 238 respectively). Additionally, each of the high voltage battery system 212 and high voltage load 214 are grounded to chassis (not shown) at ground 244.

The high voltage battery system 212 also includes a control block 248 and a grounding inductor 256. And, the high voltage load 214 includes a control block 252 and a grounding inductor 258. The control block 248 is electrically connected to the in-line high voltage connector arrangement 216 and to the ground 244 through the grounding inductor 256. Similarly, the control block 252 is electrically connected to the in-line high voltage connector arrangement 216 and to the ground 244 through the grounding inductor 258. Either of the control blocks 248, 252 (or another control block) may be configured to drive a signal into the in-line high voltage connector arrangement 216. The other of the control blocks 248, 252 (or another control block) may then be configured to detect the signal for interlock integrity.

Another concept includes disconnecting one or more of the shield grounds using one or more switches. The shield wires could then be isolated from ground at one or both ends of the connection making it easier for the modules to communicate over the shielding. Any number of communication methods could be used: applying voltage, resistance, etc. to the shield wire. These would be detected by the module at the other end of the HV connection, and then the status could be updated over a car area network.

Referring to FIG. 4, a vehicle high voltage power system 310 includes a high voltage battery system 312, a high voltage load 314, and an in-line high voltage connector arrangement 316 electrically connecting the high voltage battery system 312 and high voltage load 314. The high voltage battery system 312 includes battery cells 318, main contactors 320, a pre-charge contactor and pre-charge resistor 322, 324 respectively, a main fuse 326, and a connector mount 328. The high voltage load 314 includes a connector mount 330. The in-line high voltage connector arrangement 316 includes end mounts 332, 334 that mate with connector mounts 328, 330 respectively, in-line mounts 336, 338 that mate with each other, and high voltage shielding 340, 342 (between the end mount 332 and in-line mount 336, and between the end mount 334 and in-line mount 338 respectively). Additionally, each of the high voltage battery system 312 and high voltage load 314 are grounded to chassis (not shown) at ground 344.

The high voltage battery system 312 also includes a control block 348 and a grounding switch 360. And, the high voltage load 314 includes a control block 352 and a grounding switch 362. The control block 348 is electrically connected to the in-line high voltage connector arrangement 316 and to the ground 344 through the grounding switch 360. Similarly, the control block 352 is electrically connected to the in-line high voltage connector arrangement 316 and to the ground 344 through the grounding switch 362. Either of the control blocks 348, 352 (or another control block) may be configured to drive a signal into the in-line high voltage connector arrangement 316. The other of the control blocks 348, 352 (or another control block) may then be configured to detect the signal for interlock integrity. The control blocks 348, 352 (or other control blocks) may be configured to control the grounding switches 360, 362 respectively.

While the concept of FIG. 4 may be easy to implement, it may be less advantageous than the concepts of FIG. 2 or 3 since the grounding switches 360, 362 would have to be closed to operate the vehicle and shield HV noise. Because of this, the state of the mounts 328, 330, 332, 334, 336, 338, could only be checked at certain points when HV power was not necessary, for example at key-on. This may be sufficient for certain HV modules which also use finger proof connections as an alternative to HVIL.

Another possible concept is to have a resistive connection from the shielding to ground in one module, and the typical low impedance ground connection at the other end of the shielding. If the control block at the resistive connection end of the shielding transmits a simple signal (e.g., 12V) onto the shielding, it will take the path of least resistance across the shielding and to ground at the other end of the shielding. If the shielding connection is broken at any one of the connectors, then the only path for the signal will be a higher resistance path through the resistive shield connection in the module. The control block will be able to detect the difference in circuit resistance. Determination of the connector state, however, may only be possible while the load is not power converting.

Figure 5:
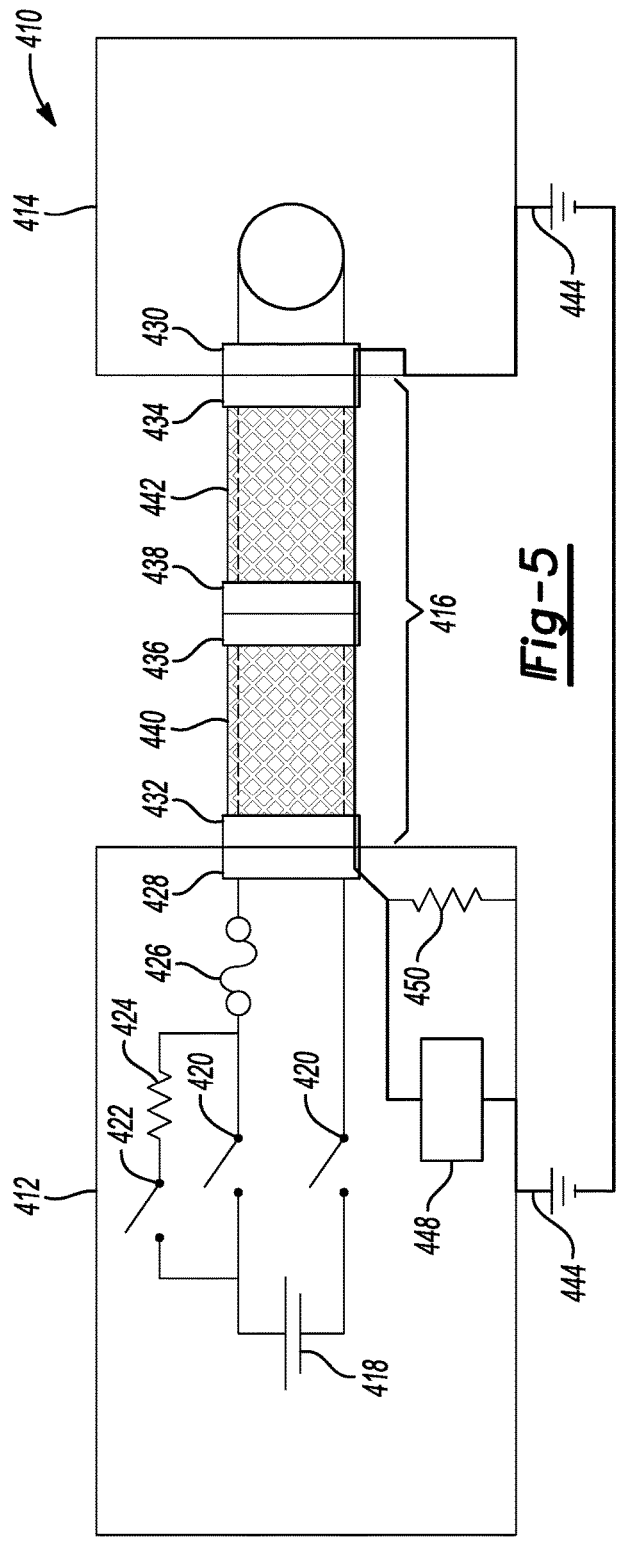

Referring to FIG. 5, a vehicle high voltage power system 410 includes a high voltage battery system 412, a high voltage load 414, and an in-line high voltage connector arrangement 416 electrically connecting the high voltage battery system 412 and high voltage load 414. The high voltage battery system 412 includes battery cells 418, main contactors 420, a pre-charge contactor and pre-charge resistor 422, 424 respectively, a main fuse 426, and a connector mount 428. The high voltage load 414 includes a connector mount 430. The in-line high voltage connector arrangement 416 includes end mounts 432, 434 that mate with connector mounts 428, 430 respectively, in-line mounts 436, 438 that mate with each other, and high voltage shielding 440, 442 (between the end mount 432 and in-line mount 436, and between the end mount 434 and in-line mount 438 respectively). Additionally, each of the high voltage battery system 412 and high voltage load 414 are grounded to chassis (not shown) at ground 444.

The high voltage battery system 412 also includes a control block 448 and a grounding resistor 450. (In other embodiments, the high voltage load 414 instead includes a control block and a grounding resistor). The control block 448 is electrically connected to the in-line high voltage connector arrangement 416 and to the ground 444 through the grounding resistor 450. The control block 448 may be configured to drive a signal into the in-line high voltage connector arrangement 416, which can be detected by the control block 448 as it travels over the in-line high voltage connector arrangement 416 and the ground 444 (chassis) for interlock integrity.

Figure 6:
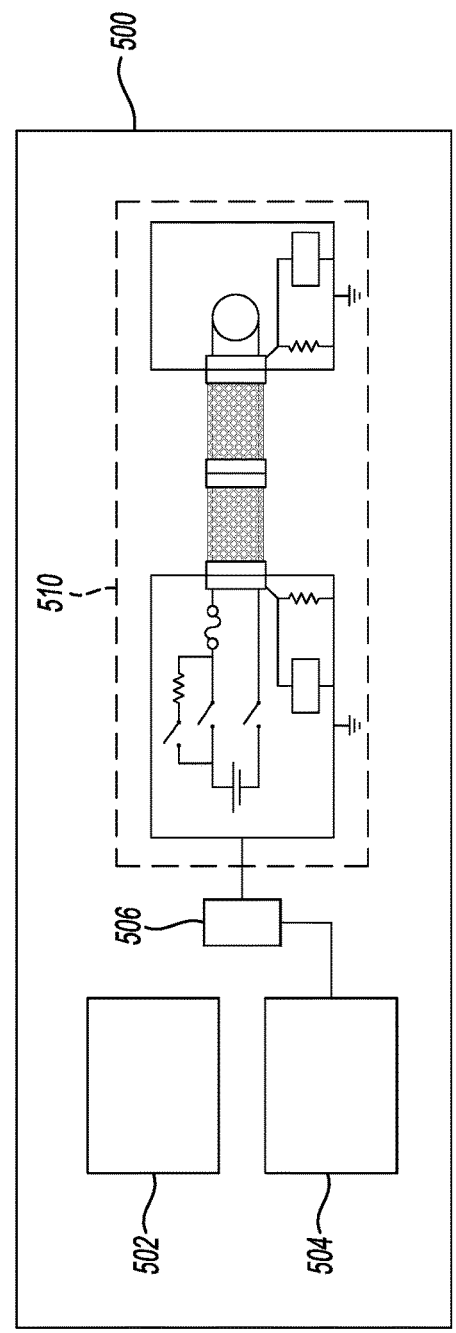
FIG. 6 is a schematic diagram of a vehicle.

Referring to FIG. 6, a vehicle 500 includes an engine 502, an electric machine 504, power electronics 506, and a high voltage power system 510. The high voltage power system can be arranged similar to any of the vehicle high voltage power systems 110, 210, 310, 410 described or otherwise contemplated herein. Either or both of the engine 502 and electric machine 504 can be used to drive the vehicle 500 as known in the art. Power can be transferred between the traction battery of the high voltage power system 510 and the electric machine 504 via the power electronics 506.

The words used in the specification are words of description rather than limitation, and it is understood that various changes may be made without departing from the spirit and scope of the disclosure and claims. As previously described, the features of various embodiments may be combined to form further embodiments that may not be explicitly described or illustrated. While various embodiments may have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. These attributes include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and may be desirable for particular applications.

What is claimed is:

1. A power system for a vehicle comprising:
   a traction battery configured to provide power to drive the vehicle;
   a load;
   a harness including wires electrically connecting the traction battery and load, and shielding covering the wires; and
   one or more control blocks programmed to drive a signal onto the shielding, and responsive to an absence of detecting feedback from the signal, to issue an interlock integrity alert.

2. The power system of claim 1, wherein the one or more control blocks include a first control block associated with the traction battery and a second control block associated with the load, and wherein the first control block is programmed to drive the signal onto the shielding and the second control block is programmed issue the interlock integrity alert.

3. The power system of claim 1, wherein an electrical path between the one or more control blocks and the shielding is grounded via a resistor.

4. The power system of claim 1, wherein an electrical path between the one or more control blocks and the shielding is grounded via an inductor having an inductance configured to filter the signal.

5. The power system of claim 1 further comprising a switch configured to selectively ground an electrical path between the one or more control blocks and the shielding.

6. The power system of claim 1, wherein the harness is an in-line connector.

7. The power system of claim 1, wherein the signal is a radio frequency signal.

8. A vehicle power system comprising:
   a battery arrangement including cells and a first control block;
   a vehicle load system including a load and a second control block; and a harness including wires electrically connecting the cells and load, and shielding covering the wires, wherein the first control block is programmed to drive a signal onto the shielding and wherein the second control block is programmed to issue an interlock integrity alert responsive to an interrupt in detecting the signal from the shielding.

9. The vehicle power system of claim 8, wherein an electrical path between the first control block and the shielding is grounded via a resistor.

10. The vehicle power system of claim 8, wherein an electrical path between the first control block and the shielding is grounded via an inductor having an inductance configured to filter the signal.

11. The vehicle power system of claim 8 further comprising a switch configured to selectively ground an electrical path between the first control block and the shielding.

12. The vehicle power system of claim 11, wherein the first control block is further programmed to control the switch.

13. The vehicle power system of claim 8, wherein the harness is an in-line connector.

14. The vehicle power system of claim 8, wherein the signal is a radio frequency signal.

15. A method for interlock detection comprising:
by one or more control blocks,
driving a signal onto shielding of a wiring harness that electrically connects a traction battery and a load configured to receive power from the traction battery, and
responsive to an absence of detecting feedback from the signal transmitted on the shielding, issuing an interlock integrity alert.

16. The method of claim 15, wherein the signal is a radio frequency signal.

17. The method of claim 15 further comprising, by the one or more control blocks, selectively actuating a switch configured to ground an electrical path between the one or more control blocks and the load.

18. The method of claim 15 further comprising, by the one or more control blocks, responsive to the absence, powering down the traction battery.

\* \* \* \* \*